United States Patent
Kitahara et al.

(10) Patent No.: US 10,571,619 B2
(45) Date of Patent: *Feb. 25, 2020

(54) QUANTUM DOT PROTECTIVE FILM, QUANTUM DOT FILM USING SAME, AND BACKLIGHT UNIT

(71) Applicant: TOPPAN PRINTING CO., LTD., Tokyo (JP)

(72) Inventors: Tsukasa Kitahara, Tokyo (JP); Osamu Tokinoya, Tokyo (JP); Takeshi Nishikawa, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/109,337

(22) PCT Filed: Jul. 16, 2015

(86) PCT No.: PCT/JP2015/070419
§ 371 (c)(1),
(2) Date: Jun. 30, 2016

(87) PCT Pub. No.: WO2016/059843
PCT Pub. Date: Apr. 21, 2016

(65) Prior Publication Data
US 2016/0327719 A1 Nov. 10, 2016

(30) Foreign Application Priority Data
Oct. 16, 2014 (JP) .................. 2014-211857

(51) Int. Cl.
*F21V 8/00* (2006.01)
*B32B 27/36* (2006.01)
(Continued)

(52) U.S. Cl.
CPC ............ *G02B 6/005* (2013.01); *B32B 3/00* (2013.01); *B32B 7/12* (2013.01); *B32B 9/04* (2013.01);
(Continued)

(58) Field of Classification Search
None
See application file for complete search history.

(56) References Cited

U.S. PATENT DOCUMENTS 5,009,485 A * 4/1991 Hall ..................... C23C 16/52
359/577
5,084,356 A * 1/1992 Deak ..................... B32B 37/12
428/412

(Continued)

FOREIGN PATENT DOCUMENTS

CN 1619362 A 5/2005
CN 101253041 A 8/2008
(Continued)

OTHER PUBLICATIONS

International Search Report dated Oct. 20, 2015 in corresponding International Application No. PCT/JP2015/070419.
(Continued)

*Primary Examiner* — Vivian Chen

(57) ABSTRACT

A first quantum dot protective film comprises a first barrier film including a silica deposition layer, and a first diffusion layer. An O/Si ratio of the silica deposition layer is 1.7 or more and 2.0 or less on an atomic ratio basis, and a refractive index of the silica deposition layer is 1.5 or more and 1.7 or less; and a reflectance of the first quantum dot protective film is 10% or more and 20% or less at each of wavelengths of 450 nm, 540 nm and 620 nm, and a transmittance of the first quantum dot protective film is 80% or more and 87% or less at each of wavelengths of 450 nm, 540 nm and 620 nm.

5 Claims, 4 Drawing Sheets

(51) Int. Cl.

| | | |
|---|---|---|
| B32B 9/04 | (2006.01) | |
| B32B 3/00 | (2006.01) | |
| B32B 27/06 | (2006.01) | |
| F21V 9/00 | (2018.01) | |
| G02B 1/10 | (2015.01) | |
| F21V 9/30 | (2018.01) | |
| G02B 1/14 | (2015.01) | |
| F21V 9/32 | (2018.01) | |
| G02B 6/00 | (2006.01) | |
| C09K 11/00 | (2006.01) | |
| B82Y 20/00 | (2011.01) | |
| G02F 1/1335 | (2006.01) | |
| G02F 1/13357 | (2006.01) | |
| G02F 1/1333 | (2006.01) | |
| B32B 7/12 | (2006.01) | |
| B32B 27/08 | (2006.01) | |
| H01L 33/50 | (2010.01) | |

(52) U.S. Cl.
CPC .............. B32B 9/045 (2013.01); B32B 27/06 (2013.01); B32B 27/08 (2013.01); B32B 27/36 (2013.01); B32B 2250/04 (2013.01); B32B 2250/05 (2013.01); B32B 2250/40 (2013.01); B32B 2250/42 (2013.01); B32B 2255/10 (2013.01); B32B 2255/20 (2013.01); B32B 2255/26 (2013.01); B32B 2255/28 (2013.01); B32B 2264/0257 (2013.01); B32B 2307/40 (2013.01); B32B 2307/412 (2013.01); B32B 2307/416 (2013.01); B32B 2307/422 (2013.01); B32B 2307/7242 (2013.01); B32B 2307/7244 (2013.01); B32B 2307/7246 (2013.01); B32B 2311/00 (2013.01); B32B 2315/00 (2013.01); B32B 2367/00 (2013.01); B32B 2457/20 (2013.01); B32B 2457/202 (2013.01); B32B 2571/00 (2013.01); B82Y 20/00 (2013.01); C09K 11/00 (2013.01); F21V 9/00 (2013.01); F21V 9/30 (2018.02); F21V 9/32 (2018.02); G02B 1/10 (2013.01); G02B 1/14 (2015.01); G02B 6/00 (2013.01); G02B 6/0011 (2013.01); G02B 6/0051 (2013.01); G02F 1/1333 (2013.01); G02F 1/1335 (2013.01); G02F 1/1336 (2013.01); G02F 1/133504 (2013.01); G02F 1/133524 (2013.01); G02F 1/133603 (2013.01); G02F 1/133606 (2013.01); G02F 1/133615 (2013.01); G02F 2001/13356 (2013.01); G02F 2001/133562 (2013.01); G02F 2001/133607 (2013.01); H01L 33/50 (2013.01); H01L 33/502 (2013.01)

(56) References Cited

U.S. PATENT DOCUMENTS

| | | | | |
|---|---|---|---|---|
| 5,085,904 | A * | 2/1992 | Deak | B32B 37/12 427/571 |
| 5,262,633 | A * | 11/1993 | Kasai | G02B 1/115 250/208.1 |
| 5,279,873 | A * | 1/1994 | Oike | A63H 27/10 428/34.4 |
| 5,532,063 | A * | 7/1996 | Shindoh | C23C 14/10 106/286.1 |
| 5,939,205 | A | 8/1999 | Yokoyama et al. | |
| 6,335,479 | B1 * | 1/2002 | Yamada | B32B 17/10 136/244 |
| 6,369,316 | B1 * | 4/2002 | Plessing | B32B 3/08 136/244 |
| 9,085,728 | B2 * | 7/2015 | Uchida | H01L 23/564 |
| 9,841,150 | B2 * | 12/2017 | Tokinoya | B32B 27/36 |
| 2002/0050287 | A1 * | 5/2002 | Yamada | B32B 17/10 136/251 |
| 2002/0160127 | A1 * | 10/2002 | Sakata | B32B 27/18 428/1.6 |
| 2002/0180924 | A1 * | 12/2002 | Sobrinho | G02F 1/133305 349/158 |
| 2003/0068486 | A1 | 4/2003 | Arney et al. | |
| 2003/0068512 | A1 * | 4/2003 | Takahashi | B32B 27/08 428/480 |
| 2004/0008507 | A1 * | 1/2004 | Lee | G02B 6/0038 362/623 |
| 2005/0249901 | A1 | 11/2005 | Yializis et al. | |
| 2006/0062902 | A1 * | 3/2006 | Sager | B22F 1/0018 427/74 |
| 2006/0062995 | A1 * | 3/2006 | Yamamoto | B32B 27/08 428/332 |
| 2006/0232735 | A1 | 10/2006 | Hokazono et al. | |
| 2006/0251905 | A1 | 11/2006 | Arakawa | |
| 2007/0268587 | A1 * | 11/2007 | Ninomiya | G02B 1/105 359/601 |
| 2008/0053516 | A1 * | 3/2008 | Hayes | B32B 17/10018 136/251 |
| 2008/0062517 | A1 | 3/2008 | Seki | |
| 2008/0248273 | A1 * | 10/2008 | Aiki | C08G 73/22 428/220 |
| 2010/0062246 | A1 | 3/2010 | Kim et al. | |
| 2010/0154886 | A1 * | 6/2010 | Robinson | C08J 7/047 136/256 |
| 2010/0187975 | A1 | 7/2010 | Tsukahara et al. | |
| 2010/0237322 | A1 * | 9/2010 | Okada | H01L 51/5012 257/13 |
| 2010/0238384 | A1 | 9/2010 | Tochigi et al. | |
| 2010/0289762 | A1 | 11/2010 | Ito et al. | |
| 2011/0002140 | A1 * | 1/2011 | Tsukahara | G02B 5/0236 362/602 |
| 2011/0052893 | A1 * | 3/2011 | Oouchi | B32B 7/12 428/216 |
| 2011/0136263 | A1 | 6/2011 | Machida et al. | |
| 2011/0194055 | A1 | 8/2011 | Kodama et al. | |
| 2012/0021197 | A1 * | 1/2012 | Matsumura | B32B 27/20 428/213 |
| 2012/0113672 | A1 * | 5/2012 | Dubrow | B82Y 20/00 362/602 |
| 2012/0156436 | A1 * | 6/2012 | Kim | C09K 11/565 428/172 |
| 2012/0228668 | A1 * | 9/2012 | Thoumazet | C23C 16/0245 257/100 |
| 2012/0241889 | A1 * | 9/2012 | Takemura | H01L 51/448 257/431 |
| 2012/0276353 | A1 * | 11/2012 | Nakatsugawa | B32B 27/36 428/215 |
| 2013/0008767 | A1 | 1/2013 | Sasaki | |
| 2013/0224503 | A1 * | 8/2013 | Suzuki | C23C 14/06 428/447 |
| 2013/0334557 | A1 * | 12/2013 | Uchida | H01L 23/564 257/98 |
| 2014/0069497 | A1 | 3/2014 | Hwang et al. | |
| 2014/0370260 | A1 * | 12/2014 | Uebayashi | B32B 9/00 428/218 |
| 2015/0030829 | A1 * | 1/2015 | Kenmochi | B32B 27/30 428/212 |
| 2015/0301257 | A1 * | 10/2015 | Choi | C09K 11/025 362/607 |
| 2015/0330602 | A1 | 11/2015 | Yonemoto et al. | |
| 2015/0338567 | A1 * | 11/2015 | Stevenson | G02B 6/0051 362/601 |
| 2016/0068749 | A1 * | 3/2016 | Kwon | C09K 11/025 252/301.36 |
| 2016/0161657 | A1 * | 6/2016 | Yamada | G02F 1/1336 349/62 |
| 2016/0195229 | A1 * | 7/2016 | Tokinoya | B32B 27/36 362/612 |
| 2016/0236443 | A1 * | 8/2016 | Hwang | G02F 1/133305 |
| 2016/0327690 | A1 * | 11/2016 | Tokinoya | B32B 27/00 |
| 2017/0157906 | A1 * | 6/2017 | Nishikawa | B32B 27/308 |

(56) References Cited

U.S. PATENT DOCUMENTS

| | | | |
|---|---|---|---|
| 2018/0024277 A1* | 1/2018 | Murata | G02B 1/14 362/84 |
| 2018/0024278 A1* | 1/2018 | Harada | G02B 1/16 |
| 2018/0231693 A1* | 8/2018 | Murata | B32B 7/02 |
| 2019/0039349 A1* | 2/2019 | Shoda | G02F 1/1336 |

FOREIGN PATENT DOCUMENTS

| | | | |
|---|---|---|---|
| CN | 103228983 A | | 7/2013 |
| JP | H10-186098 A | | 7/1998 |
| JP | 11-066969 A | * | 3/1999 |
| JP | 2002-107495 A | * | 4/2002 |
| JP | 2002-107495 A | | 4/2002 |
| JP | 2004-39640 | | 2/2004 |
| JP | 2005-147921 A | | 6/2005 |
| JP | 2005-224965 A | * | 8/2005 |
| JP | 2005-224965 A | | 8/2005 |
| JP | 2006-123288 | | 5/2006 |
| JP | 2008-010299 A | * | 1/2008 |
| JP | 2008-010299 A | | 1/2008 |
| JP | 2008-162046 A | | 7/2008 |
| JP | 2008-162046 A | * | 7/2008 |
| JP | 2008-230114 A | | 10/2008 |
| JP | 2009-231273 | | 10/2009 |
| JP | 2011-13567 | | 1/2011 |
| JP | 2011-051195 A | | 3/2011 |
| JP | 2011-063826 A | * | 3/2011 |
| JP | 2012-129195 | | 7/2012 |
| JP | 2012-164742 A | | 8/2012 |
| JP | 2013-022920 A | * | 2/2013 |
| JP | 2013-022920 A | | 2/2013 |
| JP | 2013-79994 | | 5/2013 |
| JP | 2013-079994 A | * | 5/2013 |
| JP | 5353592 | | 11/2013 |
| JP | 2013-544018 | | 12/2013 |
| JP | 2014-40572 | | 3/2014 |
| JP | 2014-113694 | | 6/2014 |
| JP | 2014-113694 A | * | 6/2014 |
| JP | 5900720 | | 3/2016 |
| KR | 10-2007-0111360 | | 11/2007 |
| KR | 10-2013-0120486 | | 11/2013 |
| KR | 10-1335266 | | 11/2013 |
| KR | 10-2014-0060218 | | 5/2014 |
| TW | 201234646 A | | 8/2012 |
| WO | WO 2004/101276 A1 | | 11/2004 |
| WO | WO 2012/064562 A1 | | 5/2012 |
| WO | WO 2012/102107 A1 | | 8/2012 |
| WO | WO 2013/133256 A1 | | 9/2013 |

OTHER PUBLICATIONS

Written Opinion of the International Search Authority for PCT/JP2015/070419, dated Oct. 20, 2015.
Korean Office Action for related Korean Patent Application No. 10-2016-7012497, dated Sep. 8, 2016.
Korean Office Action dated Dec. 1, 2016 in corresponding Korean Patent Application No. 10-2016-7012897.
Chinese Office Action dated Nov. 28, 2016 in corresponding Chinese Patent Application No. 201580002853.1.
International Search Report dated Oct. 20, 2015 in corresponding International Patent Application No. PCT/JP2015/070419.
Office Action dated Jan. 12, 2017 in U.S. Appl. No. 15/109,332.
International Preliminary Report on Patentability dated Apr. 27, 2017 in corresponding International Patent Application No. PCT/JP2015/070419.
Chinese Office Action dated Jan. 23, 2017 in corresponding Chinese Patent Application No, 201580002854.6.
International Preliminary Report on Patentability dated Feb. 2, 2017 in corresponding International Patent Application No. PCT/JP2015/070421.
Japanese Office Notification dated Nov. 4, 2016 in a corresponding Japanese Patent Application No. 2015-560891.
United States Office Action dated Jun. 29, 2017 in co-pending U.S. Appl. No. 15/109,332.
U.S. Office Action dated Dec. 29, 2017 in U.S. Appl. No. 15/109,332.
Extended European Search Report dated Mar. 7, 2018, in corresponding European Patent Application No. 15821598.8, 9 pgs.
Office Action dated Apr. 27, 2018, in U.S. Appl. No. 15/109,332, 11 pgs.
Non-Final Office Action dated Sep. 7, 2018 in U.S. Appl. No. 15/109,332 (15 pages).
Taiwan Office Action dated Oct. 15, 2018 in related Taiwan Patent Application No. 104123161 (5 pages).
Final Office Action dated Dec. 31, 2018 in U.S. Appl. No. 15/109,332 (12 pages).
Office Action dated Jun. 4, 2019 in Japanese Patent Application No. 2016-042165 (5 pages).
Office Action dated Jun. 25, 2019 in Japanese Patent Application No. 2016-042458 (2 pages).
Japanese Office Action dated Jan. 7, 2020 in Japanese Patent Application No. 2016-042165 (5 pages).

* cited by examiner

QUANTUM DOT PROTECTIVE FILM, QUANTUM DOT FILM USING SAME, AND BACKLIGHT UNIT

CROSS-REFERENCE TO RELATED APPLICATIONS

This application is a U.S. National Stage Application, which claims the benefit under 35U.S.C. § 371 of PCT International Patent Application No. PCT/JP2015/070419, filed Jul. 16, 2015 which claims the foreign priority benefit under 35 U.S.C. § 119 of Japanese Patent Application No. 2014-211857, filed Oct. 16, 2014, the contents of which are incorporated herein by reference.

TECHNICAL FIELD

The present invention relates to a quantum dot protective film, a quantum dot film using the same, and a backlight unit.

BACKGROUND ART

A liquid crystal display is a display apparatus for displaying images and the like by applying voltage to control the orientation of the liquid crystals and passing or blocking light in each area. A back light provided on the back of a liquid crystal display is used as a light source for the liquid crystal display. Although a cold cathode tube has conventionally been used as the back light, a LED (light emitting diode) has recently been used in place of the cold cathode tube for the reasons of long operating life, bright colors, and the like.

Incidentally, nano-sized fluorescent substances using quantum dots have been commercialized in recent years. The quantum dots are luminescent semiconductor nanoparticles and the diameter range of the semiconductor nanoparticles is about 1 to 20 nm. Since the quantum dots show a wide excitation spectrum and have a high quantum efficiency, they are used as the fluorescent substance for converting an LED wavelength. Further, there is such a benefit that the emission wavelength of quantum dots can be completely controlled throughout the entire visible range only by changing the dot size of the quantum dots or the kind of a semiconductor material. For this reason, quantum dots are considered to have a potential of creating many different colors in practice, particularly warm white colors strongly desired in the lighting industry. Additionally, when three types of quantum dots corresponding to the emission wavelengths of red, green, and blue are combined, white lights with different color rendering indices can be obtained. As described above, the liquid crystal display using the back light lit by the quantum dots can improve the color tones and express many of the colors identifiable by a person without increasing thickness, power consumption, costs, and production process as compared with conventional ones.

The back light using a white color LED has a structure in which a fluorescent substance having a predetermined emission spectrum (quantum dots, or the like) is diffused in a film, the surface thereof is sealed with a barrier film, and in some cases a wavelength conversion sheet with a sealed edge portion is combined with an LED light source and a light guiding panel. The barrier film prevents a moisture and a gas from passing therethrough by forming a thin film by vapor deposition or the like on the surface of a substrate such as a plastic film. The barrier film is required to prevent poor appearance such as scratches and wrinkles and to be transparent in addition to have barrier properties. For example, Patent Literature 1 proposes a back light having a structure where a fluorescent substance is interposed between barrier films for preventing deterioration of the fluorescent substance.

CITATION LIST

Patent Literature

Patent Literature 1: Japanese Unexamined Patent Publication No. 2011-13567

SUMMARY OF INVENTION

Technical Problem

The conventional barrier films have been used as wrapping materials for food, pharmaceutical products, and the like, and packaging materials for electronic devices or the like. For this reason, when a display was produced with a sealed quantum dot layer using the conventional barrier film, the barrier properties of the barrier film were insufficient and the properties of the quantum dot layer were sometimes hardly maintained due to the entrance or the like of water vapor into the quantum dot layer. Accordingly, the backlight unit including such a quantum dot layer fails to maintain high luminance, and when the backlight unit was used for a display, the display sometimes had poor appearance by the occurrence of color tone changes caused by color irregularities and color reproductivity problems such as black spots.

The present invention has an object to provide a quantum dot protective film, which has good barrier properties, is capable of achieving high luminance for an extended period of time when constituting a back light, and providing good appearance for an extended period of time when constituting a display; and a quantum dot film including such a quantum dot protective film. Further, the present invention has an object to provide a backlight unit capable of achieving high luminance and good appearance when used for a display.

Solution to Problem

The quantum dot protective film according to an embodiment of the present invention is a quantum dot protective film comprising a barrier film including a silica deposition layer and a diffusion layer, wherein a ratio of oxygen to silicon, an O/Si ratio, contained in the silica deposition layer is 1.7 or more and 2.0 or less on an atomic ratio basis, and a refractive index of the silica deposition layer is 1.5 or more and 1.7 or less; a reflectance of the quantum dot protective film is 10% or more and 20% or less and a transmittance of the quantum dot protective film is 80% or more and 95% or less, at all wavelengths of 450 nm, 540 nm, and 620 nm.

According to the quantum dot protective film, since the O/Si ratio is 1.7 or more on an atomic ratio basis, a proportion of the Si—Si bond in the silica deposition layer is reduced to low and colored metals decrease, whereby a transmittance of the silica deposition layer is increased. To the contrary, since the O/Si ratio is 2.0 or less on an atomic ratio basis, the growth of the deposition layer is densed, whereby the silica deposition layer has good barrier properties. The quantum dot protective film can reduce the entrance of water vapor or the like. Thus, when a backlight unit including the quantum dot film having such a quantum dot protective film is produced, the backlight unit maintains high luminance for an extended period of time and good appearance by preventing the occurrence of color irregularities, black spots, and the like when used for a display. Further, the refractive index of the silica deposition layer is 1.5 or more and 1.7 or less, and the reflectance of the quantum dot protective film is 10% or more and 20% or less and a transmittance of the quantum dot protective film is 80% or more and 95% or less. Accordingly, the quantum dot protective film reduces an optical interference in the film and increases the luminance of the backlight unit.

In the above quantum dot protective film, it is preferable that the barrier film have a structure in which an adhesion layer, a silica deposition layer, and a composite coating layer are laminated in this sequence on at least one surface of a polyester film, and the composite coating layer be a layer containing at least one selected from the group consisting of water soluble polymers, metal alkoxides, hydrolyzates of metal alkoxides, and silane coupling agents. According to the quantum dot protective film, since the composite coating layer having barrier properties is further provided, the barrier property against water vapor or the like is effectively improved.

In the above quantum dot protective film, it is preferable that the polyester film be a polyethylene terephthalate film formed of polyethylene terephthalate having a weight average molecular weight of 60000 or more. According to the quantum dot protective film, a concentration of the terminal carboxyl group of the polyethylene terephthalate film (PET film) is reduced and the reactive sites thus decrease, whereby the hydrolysis resistance performance of the PET film is enhanced. Thus, high barrier properties of the PET film are maintained.

In the above quantum dot protective film, it is preferable that the barrier film has a structure in which two or more of the silica deposition layers and two or more of the composite coating layers are alternately laminated one by one. According to the quantum dot protective film, since the silica deposition layers and two or more of the composite coating layers are alternately laminated one by one, the gas barrier properties are further improved and the performance of the fluorescent substance using the quantum dots can maximally be exhibited, whereby a display of high efficiency and high definition with a long operating life can consequently be obtained.

It is preferable that the above quantum dot protective film have two or more barrier films. According to the quantum dot protective film, since a plurality of barrier films are provided, the barrier properties further improve.

It is preferable that the quantum dot film according to an embodiment of the present invention comprise a quantum dot layer containing a fluorescent substance and the above quantum dot protective film. According to the quantum dot film, the quantum dot layer containing a fluorescent substance provides a wide excitation spectrum and a high quantum efficiency. Since the quantum dot film has the quantum dot protective film having good barrier properties, good optical properties such as a high quantum efficiency can be maintained for an extended period of time.

It is preferable that the above quantum dot film have a diffusion layer, a barrier film, a quantum dot layer, a barrier film, and a diffusion layer laminated in this sequence. According to the backlight, since the diffusion layers and barrier films are provided on both sides of the quantum dot layer, the quantum dot layer is sufficiently sealed and the light diffusibility is assured to both directions by the diffusion layers on both sides.

It is preferable that the above backlight unit comprise an LED light source, a light guiding panel, and the above quantum dot film disposed on the light guiding panel. According to the backlight unit, high luminance and good appearance when used for a display can be achieved for an extended period of time.

Advantageous Effects of Invention

According to the present invention, a quantum dot protective film which has good barrier properties, is capable of achieving high luminance for an extended period of time when constituting a back light and further providing good appearance for an extended period of time when constituting a display; and a quantum dot film including such a quantum dot protective film are provided. Further, according to the present invention, a backlight unit capable of providing high luminance and, when used for a display, good appearance is provided.

DESCRIPTION OF EMBODIMENTS

Figure 1:
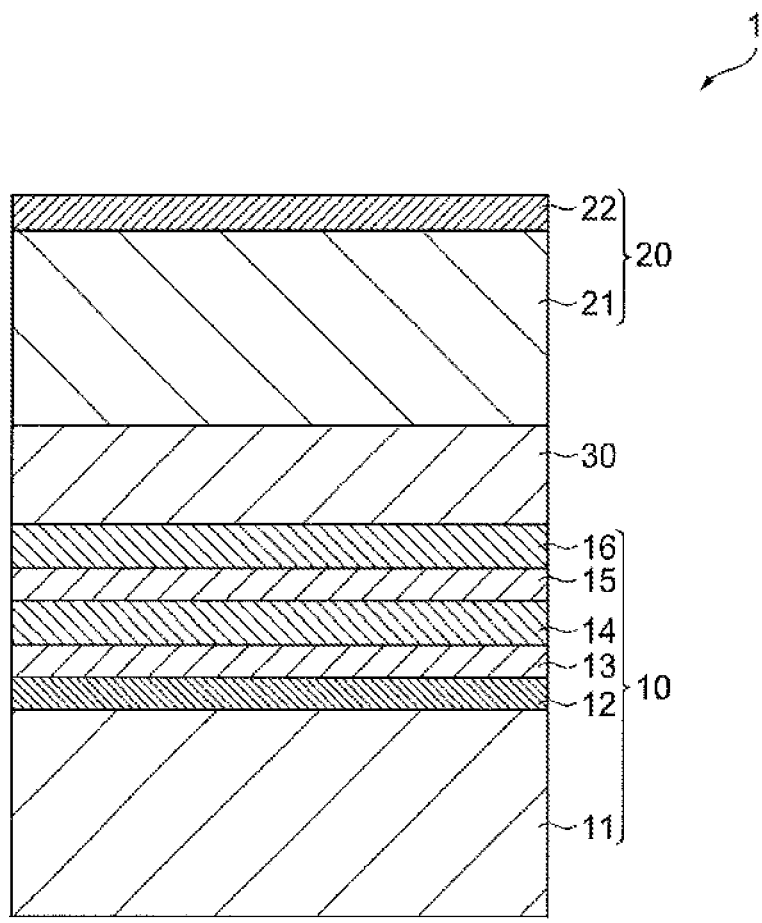
FIG. 1 is a schematic cross sectional view of the first quantum dot protective film according to an embodiment of the present invention.

Hereinafter, preferred embodiments of the present invention are described in detail with reference to the drawings. Note that, in the drawings, the same or equivalent elements are denoted by the same symbols, and the overlapping description is omitted. Further, the positional relation of the left, right, top and bottom is, unless otherwise stated, based on the positional relation as shown in the drawings. Furthermore, the scale of the drawings is not limited to the scale shown in the drawings.

(Quantum Dot Protective Film)

FIG. 1 is a schematic cross sectional view of the first quantum dot protective film according to an embodiment of the present invention. The first quantum dot protective film (quantum dot protective film) 1 comprises a first barrier film (barrier film) 10, a first diffusion film 20, and an adhesive layer 30. The adhesive layer 30 is positioned between the first barrier film 10 and the first diffusion film 20, and the first barrier film 10 and the first diffusion film 20 are affixed against each other via the adhesive layer 30.

The first barrier film 10 comprises a substrate containing a first polyester film 11, a first adhesion layer (adhesion layer) 12, a first silica deposition layer (silica deposition layer) 13, a first composite coating layer (composite coating layer) 14, a second silica deposition layer 15, and a second composite coating layer 16. The first adhesion layer 12, the first silica deposition layer 13, the first composite coating layer 14, the second silica deposition layer 15, and the second composite coating layer 16 are provided in this order on the substrate containing the first polyester film 11. The second composite coating layer 16 adheres to the adhesive layer 30.

The first diffusion film 20 comprises a substrate containing a second polyester film 21 and a first diffusion layer 22, and the first diffusion layer 22 is provided on the substrate containing the second polyester film 21. The second polyester film 21 adheres to the adhesive layer 30 at the opposite surface to the surface contacting the first diffusion layer 22.

(First Barrier Film)
<First Polyester Film>

The first polyester film 11 used in the present invention is not particularly limited and examples include polyester films comprising polyethylene terephthalate (PET) and polyethylene naphthalate (PEN), polyolefin films comprising polyethylene, polypropylene, cyclic olefin copolymers (COC), and cycloolefin polymers (COP), polyamide films comprising polystyrene films and 6,6-nylon, and engineering plastic films such as polycarbonate films, polyacrylonitrile films, and polyimide films. It is particularly preferable that the first polyester film 11 be a biaxially oriented polyester film, which is stretched in any biaxial directions. The biaxially oriented polyester film has good dimensional stability, heat resistance, and transparency.

The thickness of the first polyester film 11 is not particularly limited and it is preferable in the range from 3 μm to 200 μm, and more preferable in the range from 6 μm to 50 μm. The thickness of the first polyester film 11 is the value in consideration of the workability when the first adhesion layer 12, the first silica deposition layer 13, the first composite coating layer 14, the second silica deposition layer 15, and the second composite coating layer 16 are laminated. Note that, for laminating each layer, pre-treatment, such as plasma treatment, corona discharge treatment, ozonization, glow discharge treatment, or the like, is optionally carried out for improving the adhesiveness of each layer.

For the first polyester film 11, it is particularly preferable to use a polyethylene terephthalate film having an acid value (the number of mg of potassium hydroxide required to neutralize 1 g of a resin) of 25 mgKOH/g or less. When an acid value of the first polyester film 11 exceeds 25 mgKOH/g, the substrate stability is lost especially under a high temperature high humidity environment and the barrier properties are reduced, hence not preferable. On the other hand, when an acid value is 25 mgKOH/g or less, a substrate stability increases and the barrier properties stay stable without being reduced even under a high temperature high humidity environment. Note that, for the measurement method of the acid value, the first polyester film 11 is cut and weighed, for example, dissolved in cresol with heating and cooled, and subsequently titrated with a potassium hydroxide ethanol solution or the like to determine an acid value. A phenolphthalein solution, for example, can be used as an indicator (see JIS K0070).

It is preferable that the first polyester film 11 have good hydrolysis resistance performance since the barrier properties of the first polyester film 11 are stably expressed in an accelerated aging test of the display function under the severe environment of, for example, 60° C./90% RH and 85° C./85% RH. For achieving good hydrolysis resistance performance, it is preferable, for example, that a PET film to be the first polyester film 11 have a weight average molecular weight of 60000 or more. A PET film, when a weight average molecular weight thereof is below 60000, is typically easily hydrolyzed and the barrier properties of the PET film are likely to be deteriorated. It is preferable that, for achieving better hydrolysis resistance performance, a PET film have a concentration of the terminal carboxyl group reduced to 25 equivalent/$10^6$ g or less. When a concentration of the terminal carboxyl group is reduced to 25 equivalent/$10^6$ g or less, the reactive sites decrease, whereby the hydrolysis resistance performance of the PET film is enhanced. The concentration of the terminal carboxyl group in polyester can be measured by the method described in a literature (ANALYTICAL CHEMISTRY, Vol 26, p. 1614). The weight average molecular weight is measured by the method such as room temperature GPC analysis.

It is preferable that the PET film be a film with good light transmittance and smoothness. Accordingly, for increasing the light transmittance of the PET film, it is desirable to reduce a lubricant used for the PET film. Further, when the first silica deposition layer is laminated onto the PET film, it is desirable that the center line surface roughness (Ra) of the PET film be 30 nm or less for avoiding the occurrence of cracks or the like in the first silica deposition layer and for forming the first silica deposition layer of an even film thinness. When a center line surface roughness (Ra) is 30 nm or less, the PET film is considered to have good smoothness. The surface roughness of the PET film can be measured by the method according to JIS B0601.

<First Adhesion Layer>

The first adhesion layer 12 is provided on the first polyester film 11. The first adhesion layer 12 is provided as necessary for assuring the adhesion to the first silica deposition layer. The first adhesion layer 12 can be formed by either one of the in-line method in which the adhesion layer 12 is applied when the first polyester film 11 is stretched and the off-line method in which the adhesion layer 12 is applied in off-line after the first polyester film 11 is formed, or by both of the in-line method and the off-line method. The first adhesion layer 12 is not particularly limited but the composition for the adhesion layer for forming the first adhesion layer 12 by the in-line method can be, for example, acrylic materials and urethane materials. The composition for the adhesion layer for forming the first adhesion layer 12 by the off-line method can be, for example, a two-component reactive composite of a compound having a hydroxy group such as acrylic polyols and an isocyanate compound having an isocyanate group. The first polyester film 11 may comprise the first adhesion layer 12 not only on one surface but on both surfaces.

<First Silica Deposition Layer and Second Silica Deposition Layer>

The first silica deposition layer 13 and the second silica deposition layer 15 express the barrier properties. Examples of the inorganic compound expressing the barrier properties as the deposition layer include aluminum oxide, silicon oxide, tin oxide, magnesium oxide, zinc oxide, and mixtures thereof, and the silica deposition layer containing silicon oxide is selected in the present embodiment. The first silica deposition layer 13 and the second silica deposition layer 15 have moisture resistance in the accelerated aging test of the display function under severe environment such as 60° C./90% RH and 85° C./85% RH. The silica deposition layer is produced by a method such as the vacuum deposition method, the sputtering method, the ion plating method, or the plasma chemical vapor deposition (CVD).

It is preferable that a ratio of oxygen to silicon, an O/Si ratio, constituting each of the first silica deposition layer 13 and the second silica deposition layer 15 be 1.7 or more and 2.0 or less on an atomic ratio basis. When an O/Si ratio is below 1.7 on an atomic ratio basis, the proportion of the Si—Si bond in the first silica deposition layer 13 and the second silica deposition layer 15 increases and a large amount of colored metals are contained, whereby transmittances of the first silica deposition layer 13 and the second silica deposition layer 15 are deteriorated. When an O/Si ratio exceeds 2.0 on an atomic ratio basis, the first silica deposition layer 13 and the second silica deposition layer 15 do not express the barrier properties. It is more preferable that an O/Si ratio of the first silica deposition layer 13 and the second silica deposition layer 15 suitable to be used for a display be 1.85 to 2.0 on an atomic ratio basis.

The O/Si ratio of the silica deposition layers is measured, for example, by X-ray photoelectron spectroscopy (XPS). A specific example of the XPS measurement apparatus can be an X-ray photoelectron spectroscopy analyzer (manufactured by JEOL LTD., JPS-90MXV). An X-ray source is a non-monochromatic MgKα (1253.6 eV) and an X-ray output can be, for example, 100 W (10 kV-10 mA). For the quantitative analysis to determine an O/Si ratio, for example, a relative sensitivity factor of 2.28 for O is orbital and a relative sensitivity factor of 0.9 for Si 2p orbital are used.

The refractive indices of the organic layers (the first composite coating layer 14 and the second composite coating layer 16) constituting the first quantum dot protective film 1 such as the first composite coating layer 14 contacting the first silica deposition layer 13 and the second silica deposition layer 15 are preferably 1.5 or more and 1.7 or less. Thus, for preventing the optical interference in the first quantum dot protective film 1, the refractive indices of the first silica deposition layer 13 and the second silica deposition layer 15 are 1.5 or more and 1.7 or less. The refractive indices of the first silica deposition layer 13 and the second silica deposition layer 15 are more preferably 1.6 or more and 1.65 or less from a perspective of transparency to be used for a display in addition to the barrier properties. Note that, when measuring a refractive index of the silica deposition layers, some silica deposition films having different refractive indices are formed on a PET film by physical vapor deposition (PVD). The refractive index of the silica deposition layer is calculated from the transmittance curve generated by the thickness of the silica deposition layer and a light interference.

It is preferable that the thicknesses of the first silica deposition layer 13 and the second silica deposition layer 15 range from 5 nm to 300 nm. When the thicknesses of the first silica deposition layer 13 and the second silica deposition layer 15 are below 5 nm, it is difficult to obtain an even film and also difficult to fully function to be a gas barrier material. When the thicknesses of the first silica deposition layer 13 and the second silica deposition layer 15 exceed 300 nm, it is difficult for the first silica deposition layer 13 and the second silica deposition layer 15 to stay flexible and, after forming the deposition film, cracks are likely to occur on the deposition film by external factors such as bending and pulling. The thicknesses of the first silica deposition layer 13 and the second silica deposition layer 15 range more preferably from 10 nm to 50 nm when considering the productivity by the in-line film formation.

The methods for forming the first silica deposition layer 13 and the second silica deposition layer 15 may be any of; for example, the vacuum deposition method, the sputtering method, the ion plating method, and the plasma chemical vapor deposition (CVD). For the heating method required by the vacuum deposition method, any one of the electron beam heating method, resistance heating method, and induction heating method can be used. For increasing the light transmittance of the first silica deposition layer 13 and the second silica deposition layer 15, for example, a reactive deposition method in which various gases such as oxygen are injected may be used.

<First Composite Coating Layer and Second Composite Coating Layer>

The first composite coating layer 14 and the second composite coating layer 16 have gas barrier properties and formed using a coating agent. The coating agent has, for example, as the main agent, an aqueous solution or a solution in a mixture of water/alcohol containing at least one selected from the group consisting of water soluble polymers, metal alkoxides, hydrolyzates of metal alkoxides, and silane coupling agents.

The coating agent is specifically prepared by, for example, directly mixing a metal alkoxide, a hydrolyzate of a metal alkoxide, and a silane coupling agent with an aqueous solution or a solution in a mixture of water/alcohol of a water soluble polymer. Alternatively, the coating agent is prepared by, for example, mixing a metal alkoxide that has been subjected to treatment such as hydrolysis in advance and a silane coupling agent with an aqueous solution or a solution in a mixture of water/alcohol of a water soluble polymer. The solution of the coating agent is applied onto the first adhesion layer 12 and then dried with heating to form the first composite coating layer 14 and the second composite coating layer 16. Further, the solution of the coating agent is applied onto each of the first silica deposition layer 13 and the second silica deposition layer 15, and then dried with heating to form the first composite coating layer 14 and the second composite coating layer 16.

Examples of the water soluble polymer used for the coating agent include hydroxyl group-containing polymer compounds. Examples of the hydroxyl group-containing polymer compound include polyvinyl alcohol (PVA), polyvinylpyrrolidone, starches, methylcellulose, carboxymethylcellulose, and sodium alginate. PVA is particularly preferable as the coating agent. The composite coating layers made of PVA have good gas barrier properties.

The metal alkoxides are the compounds represented by the formula $M(OR)_n$, (wherein M is a metal such as Si, Ti, Al, or Zr, R is an alkyl group such as $CH_3$ or $C_2H_5$, and n is the number corresponding to the valence of M). Specific examples of the metal alkoxide include tetraethoxysilane $[Si(OC_2H_5)_4]$ and triisopropoxy aluminum $[Al(O\text{-}2'\text{-}C_3H_7)_3]$. Tetraethoxysilane and triisopropoxy aluminum are particularly preferable to be the metal alkoxide. Tetraethoxysilane and triisopropoxy aluminum are relatively stable in an aqueous solvent after hydrolyzed.

The silane coupling agent is a compound represented by the formula $R^1_m Si(OR^2)_{4-m}$, (wherein $R^1$ is an organic functional group, $R^2$ is an alkyl group such as $CH_3$ or $C_2H_5$, and m is an integer of 1 to 3). Specific examples of the silane coupling agent can include ethyltrimethoxysilane, vinyltrimethoxysilane, γ-chloropropylmethyldimethoxysilane, γ-chloropropyltrimethoxysilane, glycidoxypropyltrimethoxysilane, γ-methacryloxypropyltrimethoxysilane, and γ-methacryloxypropylmethyldimethoxysilane. In the solution of the silane coupling agent, an isocyanate compound or known additives such as a dispersant, a stabilizer, a viscosity adjuster, and a coloring agent may be added, as necessary, within the range in which the gas barrier properties are not affected.

The application method of the coating agent may be any of the known conventional methods such as a dipping method, a roll coating method, a screen printing method, spray method, and a gravure printing method. The thicknesses of the first composite coating layer 14 and the second composite coating layer 16 after dried are preferably 0.01 μm or more and 50 μm or less, and more preferably 0.1 μm or more and 10 μm or less. When the thicknesses of the composite coating layers after dried are below 0.01 μm, an even coating film cannot be obtained and sufficient gas barrier properties are not achieved in some cases. When the thicknesses of the composite coating layers after dried exceed 50 µm, cracks are liable to occur in the composite coating layers.

<Adhesive Layer>

The adhesive layer 30 is used to affix the first barrier film 10 and the first diffusion film 20 to each other. The material for the adhesive layer 30 can be, for example, adhesives and pressure-sensitive adhesives containing acrylic materials, polyester materials, or the like. For reducing the thickness of the first quantum dot protective film 1, it is desirable that the thickness of the adhesive layer 30 be 10 µm or less.

(First Diffusion Film)

<Second Polyester Film>

The substrate containing the second polyester film 21 can be, as for the substrate containing the second polyester film 21, polyester films such as PET and PEN. It is particularly preferable that the second polyester film 21 be a biaxially oriented polyester film, which is stretched in any biaxial directions. The biaxially oriented polyester film has good dimensional stability, heat resistance, and light transmittance. It is desirable that the PET film used for the second polyester film 21 be also a film with good light transmittance and smoothness.

<First Diffusion Layer>

The first diffusion layer 22 is provided with an uneven configuration on the surface thereof to impart the light diffusibility. Further, the fringe (Moire) protective function, anti-reflection function, and the like are also imparted. The uneven configuration is formed on the first diffusion layer 22 by, for example, the method of coating an organic layer in which particles or the like are dispersed and the method of further embossing the organic layer after coated. In the method of coating an organic layer in which particles or the like are dispersed, for example, microparticles are embedded so that a part of the microparticles is exposed from the surface of the organic layer. Thus, fine unevenness is generated on the surface of the first diffusion layer 22, whereby the occurrence of Newton's rings is prevented in the first diffusion layer 22.

Examples of the organic layer include layers containing polymer resins such as polyester resins, acrylic resins, acrylic urethane resins, polyester acrylate resins, polyurethane acrylate resins, epoxy acrylate resins, and urethane resins.

Further, the organic layer can be, for example, a layer containing a polymer resin such as thermoplastic resins, thermosetting resins, and ultraviolet curable resins.

Examples of the thermoplastic resin include cellulose derivatives such as acetyl cellulose, nitrocellulose, acetyl butyl cellulose, ethyl cellulose, and methyl cellulose; vinyl resins such as vinyl acetate and copolymers thereof, vinyl chloride and copolymers thereof, and vinylidene chloride and copolymers thereof; acetal resins such as polyvinyl formal and polyvinyl butylal; acrylic resins such as acrylic resins and copolymers thereof and methacrylic resins and copolymers thereof; polystyrene resins, polyamide resins, linear polyester resins, fluororesins, and polycarbonate resins.

Examples of the heat curable resin include phenol resins, urea melamine resins, polyester resins, and silicone resins.

Examples of the ultraviolet curable resin include photopolymerizable prepolymers such as epoxy acrylate, urethane acrylate, and polyester acrylate. Further, the ultraviolet curable resin can be composed using the above photopolymerizable prepolymer as the main component and a monofunctional or polyfunctional monomer as a diluent.

It is preferable that the thickness (film thickness) of the organic layer is in the range from 0.1 µm to 20 µm, and it is particularly preferable that it is in the range from 0.3 µm to 10 µm. When a film thickness of the organic layer is below 0.1 µm, an even film cannot be obtained because a film thickness is too small, and the optical functions cannot fully be exhibited in some cases, hence not preferable. On the other hand, when a film thickness exceeds 20 µm, the microparticles are not exposed to the surface of the first diffusion layer 22 and the unevenness imparting effect may not be rendered, and also the transparency is reduced and a fad of making a display as thin as possible is not met, hence not preferable.

Examples of the particles to be dispersed in the organic layer can include inorganic microparticles of silica, clay, talc, calcium carbonate, calcium sulfate, barium sulfate, aluminum silicate, titanium oxide, synthetic zeolite, alumina, smectite, zirconia and the like. Examples of the particles to be dispersed in the organic layer can include organic microparticles comprising styrene resins, urethane resins, benzoguanamine resins, silicone resins, acrylic resins, ethylene tetrafluoride resins, polyethylene resins, and epoxy resins. Of these, any one may singly be used, or two or more may be used.

It is preferable that the average primary particle size of the microparticle be 0.5 or more and 30 µm or less. In the present embodiment, the average primary particle size can be measured by the laser diffraction method. When an average particle size of the microparticles is below 0.5 µm, the effect of imparting unevenness to the surface of the first diffusion layer 22 cannot be rendered, hence not preferable. On the other hand, when an average particle size exceeds 30 µm, particles larger than the film thickness of the organic layer are to be used and inconvenience such as causing reduction in a light beam transmittance is induced, hence not preferable. To the contrary, when an average particle size is within the above range, the uneven configuration can be provided on the surface while maintaining a high light beam transmittance.

Note that, for the first quantum dot protective film 1 of FIG. 1, it is desirable that the reflectance be 10% or more and 20% or less at each of a wavelength in the blue region of 450 nm, a wavelength in the green region of 540 nm, and a wavelength in the red region of 620 nm. The reflectance correlates with the optical interference by the first barrier film 10. When a reflectance exceeds 20% at each wavelength, color irregularities significantly appear by the optical interference and poor appearance is caused even when the first quantum dot protective film 1 is used as a diffusion sheet on the light guiding panel (see FIG. 2). When a reflectance is below 10% at each wavelength, the O/Si ratio and the refractive index of the first silica deposition layer 13 and the second silica deposition layer 15 in the first barrier film 10 are out of the above preferable value ranges, due to which the barrier properties of the first barrier film 10 may not be exhibited.

Further, it is desirable that a transmittance of the first quantum dot protective film 1 be 80% or more and 95% or less at each of a blue wavelength of 450 nm, a green wavelength of 540 nm, and a red wavelength of 620 nm. When a transmittance is below 80%, it is not preferable because such a transmittance is low and reduces the light conversion efficiency of the quantum dot layer.

(Backlight Unit)

Figure 2:
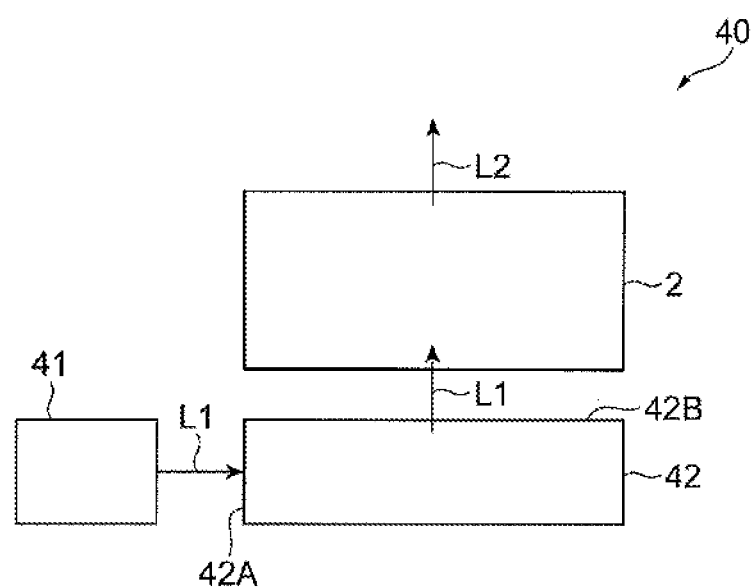
FIG. 2 is a schematic cross sectional view of the backlight unit according to an embodiment of the present invention.

FIG. 2 is a schematic cross sectional view of the backlight unit according to an embodiment of the present invention. The backlight unit 40 comprises a first quantum dot film 2, an LED light source 41, and a light guiding panel 42. The first quantum dot film 2 includes the quantum dot layer 3 (see FIG. 3). The light guiding panel 42 comprises a first side 42A and a second side 42B orthogonal to or intersecting the first side 42A, and the LED light source 41 is disposed near the first side 42A of the light guiding panel 42. The LED light source 41 contains, for example, one or more LED elements. The luminescent color of the LED element can be blue, purple, or of a lower wavelength than purple. The LED light source 41 emits an LED light L1 toward the first side 42A of the light guiding panel 42. The LED light L1 is irradiated from the second side 42B via the light guiding panel 42 toward the first quantum dot film 2. In the first quantum dot film 2, the quantum dot layer 3 generates a white light L2 when the irradiation of the LED light L1 is received. For example, when a liquid crystal panel is installed near the first quantum dot film 2, the white light L2 is emitted to the liquid crystal panel.

(First Quantum Dot Film)

Figure 3:
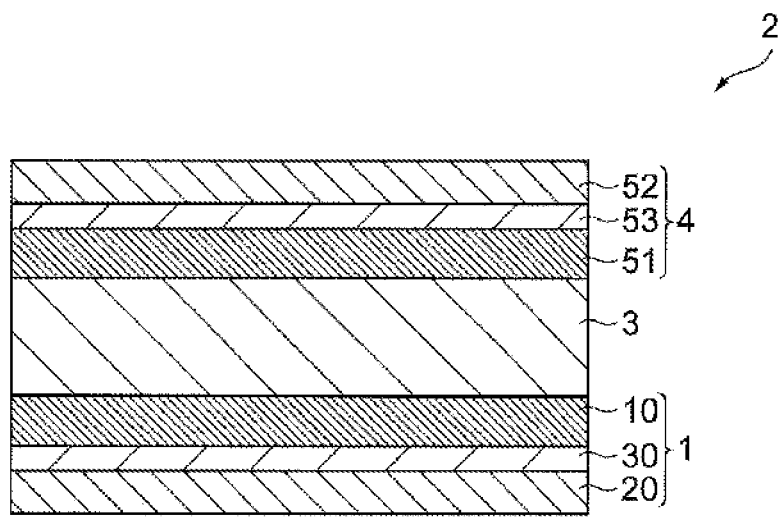
FIG. 3 is a schematic cross sectional view of the first quantum dot film according to an embodiment of the present invention.

FIG. 3 is a schematic cross sectional view of the first quantum dot film according to an embodiment of the present invention. The first quantum dot film 2 comprises a quantum dot layer 3, and the first quantum dot film 2 has a structure in which the quantum dot layer 3 is interposed between a first quantum dot protective film 1 and a second quantum dot protective film 4, which is produced by the same method as the first quantum dot protective film 1. The second quantum dot protective film 4 comprises a second barrier film 51, a second diffusion film 52, and a second adhesive layer 53. The second adhesive layer 53 is positioned between the second barrier film 51 and the second diffusion film 52, and the second barrier film 51 and the second diffusion film 52 are affixed against each other via the second adhesive layer 53. The structure of this first quantum dot film 2 imparts the barrier properties to the quantum dot layer 3. The quantum dot layer 3 is affixed with the first barrier film 10 of the first quantum dot protective film 1 and the second barrier film 51 of the second quantum dot protective film 4.

The quantum dot layer 3 is formed from a mixture for a quantum dot layer of a quantum dot compound and a photosensitive resin, or the like, such as an acrylic resin or an epoxy resin. For forming the quantum dot layer 3, the mixture for a quantum dot layer is applied onto the first barrier film 10 and the second barrier film 51. When a UV irradiation is applied to the mixture for a quantum dot layer, the photosensitive resin contained in the mixture for a quantum dot layer cures. Thus, the first quantum dot film 2, in which the quantum dot layer 3 is interposed between the first quantum dot protective film 1 and the second quantum dot protective film 4, is formed. Note that the mixture for a quantum dot layer may further contain, for example, a heat curable resin or a chemically curable resin, and the mixture for a quantum dot layer may be, for example, heat-cured after UV-cured.

In the quantum dot layer 3, two fluorescent substances containing a quantum dot compound are used, and, for example, two fluorescent substances are mixed with each other and sealed with a photosensitive resin or the like. Alternatively, in the quantum dot layer 3, two layers, i.e., a fluorescent substance layer in which one fluorescent substance is sealed and a fluorescent substance layer in which another fluorescent substance is sealed are laminated. The excitation wavelengths of one of the fluorescent substance are substantially identical, and the excitation wavelength is determined by the wavelength of the LED light source 41. The fluorescent colors of the two fluorescent substances are different from each other, and the two fluorescent substances have the fluorescent colors of, for example, red and green. The fluorescent light wavelength of the fluorescent substance and the wavelength of the LED light source 41 are selected based on the spectrum characteristics of color filters at the pixel of the liquid crystal module. The fluorescent peak wavelengths of the fluorescent substance can be, for example, 610 nm in the red region and 550 nm in the green region.

The quantum dot layer 3 has core-shell structure comprising, for example, a light-emitting core and a shell of a protective film coating the core. The core can contain, for example, cadmium selenide (CdSe) and the shell can contain zinc sulfide (ZnS). For example, in the quantum dots containing the CdSe core and the ZnS shell, the surface defects of CdSe particles are coated with ZnS with a wide band gap, whereby the quantum yield of the quantum dots is enhanced. The fluorescent substance may have a structure in which the core may be double-coated by two shells. In the double coated core-shell structure, for example, the core contains CdSe and two shells can each separately contain zinc selenide (ZnSe) and ZnS.

The first quantum dot film 2 is disposed between the light guiding panel 42 and, for example, a liquid crystal panel. Consequently, for example, a diffusion layer is provided on both surfaces of the first quantum dot film 2 to avoid the inconvenience of Newton's ring, or the like, caused by laminating plastic films on each other. The thickness of the quantum dot layer 3 is, for example, several tens of μm to several hundreds of μm.

In the first quantum dot protective film 1, when the first silica deposition layer 13 and the first composite coating layer are laminated and the second silica deposition layer 15 and the second composite coating layer are laminated, the gas barrier properties are improved. In other words, when the first barrier film has a structure in which two or more of the silica deposition layers and two or more of the composite coating layers are alternately laminated one by one, the performance of the fluorescent substance which uses the quantum dots can maximally be exhibited and, as a result, a display of high efficiency and high definition with long operating life, can be obtained.

(Third Quantum Dot Protective Film)

Figure 4:
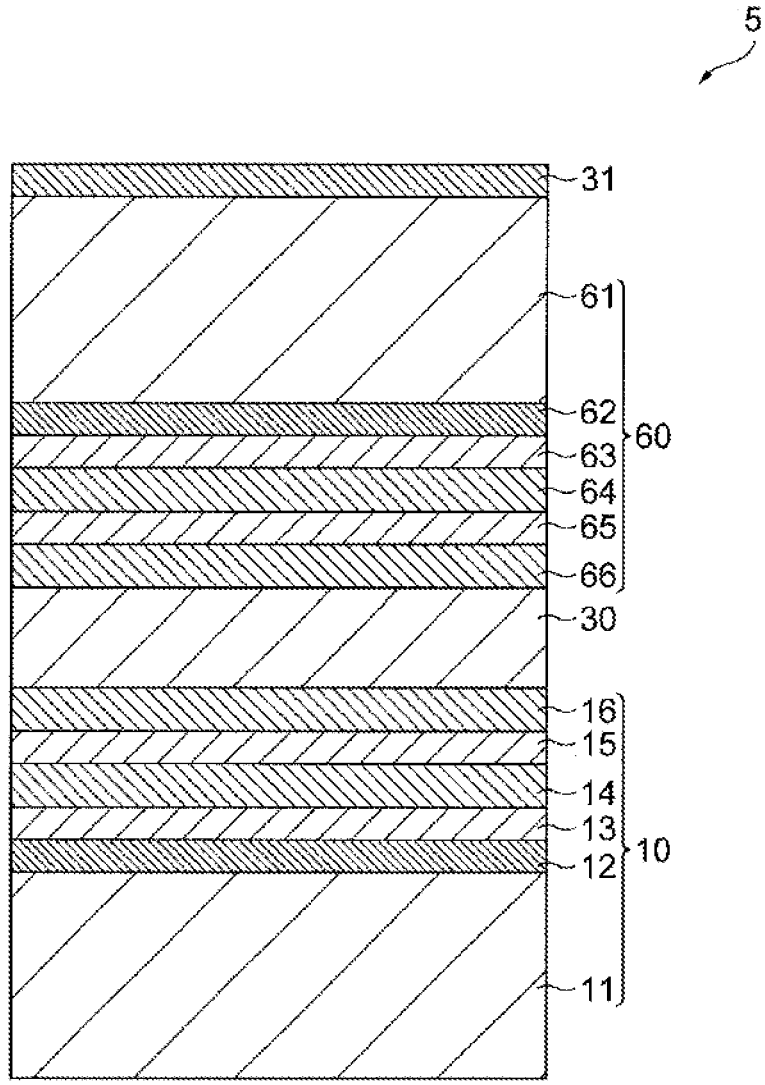
FIG. 4 is a schematic cross sectional view of the third quantum dot protective film according to an embodiment of the present invention.

FIG. 4 is a schematic cross sectional view of the third quantum dot protective film according to an embodiment of the present invention. The third quantum dot protective film 5 comprises a first barrier film 10, a third barrier film 60, an adhesive layer 30, and a second diffusion layer 31. The adhesive layer 30 is positioned between the first barrier film 10 and the third barrier film 60 to affix the first barrier film 10 and the third barrier film 60 against each other. The second diffusion layer 31 in the third barrier film 60 is provided on the opposite surface to the surface on which the third barrier film 60 contacts the adhesive layer 30. The third quantum dot protective film 5 has light diffusibility by comprising the second diffusion layer 31.

The first barrier film 10 comprises a substrate containing a first polyester film 11, a first adhesion layer 12, a first silica deposition layer 13, a first composite coating layer 14, a second silica deposition layer 15, and a second composite coating layer 16. On the substrate containing the first polyester film 11, the first adhesion layer 12, the first silica deposition layer 13, the first composite coating layer 14, the second silica deposition layer 15, and the second composite coating layer 16 are provided in this order. The second composite coating layer 16 adheres to the adhesive layer 30.

The third barrier film 60 comprises a substrate containing a second polyester film 61, a second adhesion layer 62, a third silica deposition layer 63, a third composite coating layer 64, a fourth silica deposition layer 65, and a fourth composite coating layer 66. The second adhesion layer 62, the third silica deposition layer 63, the third composite coating layer 64, the fourth silica deposition layer 65, and the fourth composite coating layer 66 are provided in this sequence on the substrate containing the second polyester film 61. The fourth composite coating layer 66 adheres to the adhesive layer 30.

Note that when the third quantum dot protective film 5 and a fourth quantum dot protective film which is the same as the third quantum dot protective film are used in place of the first quantum dot protective film 1 and the second quantum dot protective film 4, the second quantum dot film can be produced by the same method as the first quantum dot film 2.

EXAMPLES

Hereinafter, the present invention is described below in further detail with reference to Examples and Comparative Examples, but is not limited thereto.

Example 1

(Production of First Barrier Film)

A composition for an adhesion layer was applied on one surface of a 16 μm-thickness PET film substrate formed using PET having a weight average molecular weight of 60000 to laminate a 0.1 μm-thickness first adhesion layer. Next, a first silica deposition layer was laminated on the first adhesion layer by the physical vapor deposition method so that a thickness thereof was 30 nm. On the first silica deposition layer, a 1 μm-thickness first composite coating layer was formed by the wet coating method using a composition for a composite coating layer containing a coating agent. Further, on the first composite coating layer, a second silica deposition layer was laminated so that a thickness thereof was 30 nm. Subsequently, on the second silica deposition layer, a 1 μm-thickness second composite coating layer was formed by the wet coating method using a composition for a composite coating layer to produce a first barrier film. The O/Si ratio was 1.8 on an atomic ratio basis and the refractive index was 1.61 for the first silica deposition layer and the second silica deposition layer.

The composition for an adhesion layer was an ethyl acetate solution of an acrylic polyol and tolylene diisocyanate. The OH group of the acrylic polyol and the NCO group of tolylene diisocyanate were in the same amount. The concentration of the solid content of the acrylic polyol and the tolylene diisocyanate together in the ethyl acetate solution was 5 mass %.

In the production of the composition for a composite coating layer, 10.4 g of tetraethoxysilane was added to 89.6 g of 0.1 N (normal concentration) hydrochloric acid and the obtained hydrochloric acid solution was stirred for 30 minutes to hydrolyze tetraethoxysilane. The concentration of the solid content after hydrolysis was 3 mass % on an $SiO_2$ conversion basis. The hydrolyzed solution of tetraethoxysilane and a 3 mass % aqueous solution of polyvinyl alcohol were mixed to prepare the composition for a composite coating layer. The mixing ratio of the hydrolyzed solution of tetraethoxysilane and polyvinyl alcohol was 50 to 50 on a mass % conversion basis.

For forming the first and second silica deposition layers, suitable deposition conditions were determined by changing deposition conditions such as the type of materials to be deposited, before the formation. The O/Si ratio of the silica deposition layers was analyzed using an X-ray photoelectron spectroscopy analyzer (manufactured by JEOL LTD., JPS-90MXV). The measurement was carried out using a non-monochromatic MgKα (1253.6 eV) as an X-ray source at an X-ray output of 100 W (10 kV-10 mA). The quantitative analysis for determining an O/Si ratio of the silica deposition layers was carried out using relative sensitivity factors of 2.28 for O 1 s and of 0.9 for Si 2 p. The refractive indices of the silica deposition layers were calculated by the simulation using peak wavelengths on the transmittance curve generated by the thickness of the silica deposition layer and a light interference.

(Formation of First Diffusion Film)

On a 50 μm-thickness PET film substrate, a diffusion layer in which olefin particles having a particle size of 3 μm were dispersed in a urethane binder was applied so that a thickness thereof was 5 μm. Thus, a first diffusion film having a haze value of 60% (JIS K7136) was obtained.

(Production of First Quantum Dot Protective Film)

The second composite coating layer of the first barrier film was adhered by an adhesive layer to the opposite surface to the surface contacting the diffusion layer of the second polyester film to produce the first quantum dot protective film. The adhesive layer was produced using a two-component curable urethane adhesive. The thickness of the adhesive layer after adhered was 5 μm.

(Production of the First Quantum Dot Film)

A fluorescent substance having a CdSe/ZnS core-shell structure was obtained by the following method. First, a solution of octadecene to which octylamine and cadmium acetate were added was mixed with a solution of trioctylphosphine in which selenium was dissolved in a mass ratio of 1:1, and the mixture was allowed to pass through a heated microchannel to obtain a solution of CdSe microparticles, which were to be nuclear microparticles. Subsequently, the CdSe microparticle solution and a solution of $[(CH_3)_2NCSS]_2Zn$ dissolved in trioctylphosphine were mixed in a mass ratio of 1:1 and the mixture was allowed to pass through a heated microchannel to obtain a fluorescent substance of the CdSe/ZnS structure. The obtained fluorescent substance was mixed with a photosensitive resin (epoxy resin) to obtain a mixture for a quantum dot layer. Then, the mixture for a quantum dot layer was applied onto the first barrier film of the first quantum dot protective film, and the second quantum dot protective film was laminated onto the first quantum dot protective film so that the surface of the first barrier film onto which the mixture for a quantum dot layer was applied was superimposed on the surface of the second barrier film of the second quantum dot protective film produced by the same method as in the first quantum dot protective film. The mixture for a quantum dot layer was irradiated with UV to cure the photosensitive resin contained in the mixture for a quantum dot layer. By this procedure, the first quantum dot film in which the quantum dot layer was interposed between the first and the second quantum dot protective films was formed.

(Production of Backlight Unit)

A backlight unit was produced by combining the obtained quantum dot film with an LED light source and a light guiding panel.

Example 2

A first barrier film and a third barrier film were produced by the same process as in Example 1. In Example 2, the first barrier film and the third barrier film were affixed to each other via an adhesive layer. On the PET film of the third barrier film, a diffusion layer in which olefin particles having a particle size of 3 μm were dispersed in a urethane binder was applied so that a thickness thereof was 5 μm. Thus, a third quantum dot protective film having a haze value of 60% (JIS K7136) was obtained. Using two of the third quantum dot protective films, a second quantum dot film was obtained by the same method as in Example 1.

Comparative Example 1

The O/Si ratio of the SiO deposition material was changed and the conditions of the physical vapor deposition were adjusted so that silica deposition layers had an O/Si ratio of 1.4 on an atomic ratio basis and a refractive index of 1.75, whereby a first and a second silica deposition layers were produced. A first quantum dot film was obtained by the same method as in Example 1, except the values of the O/Si ratio and the refractive index of the silica deposition layers.

Comparative Example 2

The O/Si ratio of the SiO deposition material was changed and the conditions of the physical vapor deposition were adjusted so that silica deposition layers had an O/Si ratio of 2.1 on an atomic ratio basis and a refractive index of 1.42, whereby a first and a second silica deposition layers were produced. A first quantum dot film was obtained by the same method as in Example 1, except the values of the O/Si ratio and the refractive index of the silica deposition layers.

<Evaluation of Quantum Dot Protective Films and Backlight Unit>

Table 1 shows the evaluation results on the reflectance and transmittance of the quantum dot protective films produced in Example 1, Example 2, Comparative Example 1, and Comparative Example 2.

Table 2 shows the evaluation results on the water vapor permeability of the quantum dot protective films, and the luminance and appearance of the backlight unit produced in Example 1, Example 2, Comparative Example 1, and Comparative Example 2.

In Table 1 and Table 2, Examples and Comparative Examples in which the first quantum dot protective film was used are denoted by First under Quantum dot protective film constituent. In Table 1 and Table 2, Example in which the third quantum dot protective film was used is denoted by Third under Quantum dot protective film constituent.

TABLE 1

|  | Quantum dot protective film constituent | O/Si ratio | Refractive index | Reflectance (%) | | | Transmittance (%) | | |
| --- | --- | --- | --- | --- | --- | --- | --- | --- | --- |
|  |  |  |  | 450 nm | 540 nm | 620 nm | 450 nm | 540 nm | 620 nm |
| Example 1 | First | 1.8 | 1.61 | 12 | 12 | 10 | 85 | 84 | 85 |
| Example 2 | Third | 1.8 | 1.61 | 15 | 16 | 12 | 85 | 83 | 87 |
| Comparative Example 1 | First | 1.4 | 1.75 | 24 | 18 | 17 | 71 | 82 | 81 |
| Comparative Example 2 | First | 2.1 | 1.42 | 9 | 9 | 7 | 90 | 89 | 92 |

TABLE 2

|  | Quantum dot protective film constituent | Water vapor permeability (g/m² · day) | Backlight unit | | | |
| --- | --- | --- | --- | --- | --- | --- |
|  |  |  | Luminance (cd/m²) | | Appearance | |
|  |  |  | Initial | After preserved | Initial | After preserved |
| Example 1 | First | <0.01 | 92 | 85 | A | A |
| Example 2 | Third | <0.01 | 88 | 87 | A | A |
| Comparative Example 1 | First | <0.01 | 75 | 73 | B | — |
| Comparative Example 2 | First | 1.2 | 95 | <50 | A | B |

The reflectance and transmittance of the quantum dot protective films were measured at the wavelengths of 450 nm, 540 nm, and 620 nm using a spectrophotometer (tradename: SHIMAZU UV-2450). For the measurement, the measuring beam was irradiated from the opposite surface to the diffusion layer of the quantum dot protective film. The water vapor permeability (g/m²·day) of the quantum dot protective films was measured using a water vapor permeation analysis system (manufactured by Modern Control, Inc., Permatran 3/33) under 40° C./90% RH atmosphere.

The measurement of the luminance and evaluation of the appearance of the backlight unit were carried out before and after a 1000 hour-preservation test under 60° C./90% RH atmosphere. In Table 2, the term Initial means before the preservation test, and the term After preserved means after the preservation test. The luminance of the backlight unit was measured using a luminance meter (manufactured by Konica Minolta, Inc., LS-100). The appearance of the backlight unit was evaluated as "A" when the backlight unit used for a display had an acceptable appearance, but evaluated as "B" when a display had color tone changes caused by color irregularities and color reproducivity problems such as black spots. In Table 2, "-" means that the evaluation was not necessary.

As shown in Table 2, the backlight unit using the barrier film of Example 1 or Example 2 initially provided high luminance, the distinctive feature of the quantum dot displays, and such a high luminance was verified to last even after the severe preservation test under 60° C./90% RH atmosphere. The barrier properties of the barrier films were shown to be maintained even under the severe environment. When the barrier properties are poor, the luminance of the back light after set under the severe environment reduces.

In Comparative Example 1, since the refractive index of the silica deposition layers is high, the reflectance of the quantum dot protective film is high, while the transmittance is low. When the transmittance is low, the luminance is low and the appearance becomes opaque, whereby the protective film hardly meets the specifications for the display use. In Comparative Example 2, since the reflectance of the silica deposition layers is low, the transparency (light transmission properties) of the quantum dot protective film is high. However, in Comparative Example 2, since the O/Si ratio of the silica deposition layers exceeds 2.0 on an atomic ratio basis, the barrier properties were not sufficiently exhibited and the luminance was found to be lost in a short period of time. The backlight unit of Comparative Example 2 was revealed to be unreliable for the display use.

INDUSTRIAL APPLICABILITY

The present invention provides a quantum dot protective film, which has good barrier properties, is capable of achieving high luminance for an extended period of time when constituting a back light, and further providing good appearance for an extended period of time when constituting a display; and a quantum dot film including such a quantum dot protective film. Further, the present invention provides a backlight unit capable of achieving high luminance and good appearance when used for a display.

REFERENCE SIGNS LIST

1 . . . First quantum dot protective film, 2 . . . First quantum dot film, 3 . . . Quantum dot layer, 4 . . . Second quantum dot protective film, 5 . . . Third quantum dot protective film, 10 . . . First barrier film (barrier film), 11 . . . First polyester film, 12 . . . First adhesion layer (adhesion layer), 13 . . . First silica deposition layer (silica deposition layer), 14 . . . First composite coating layer, 15 . . . Second silica deposition layer, 16 . . . Second composite coating layer, 20 . . . First diffusion film, 21 . . . Second polyester film, 22 . . . First diffusion layer, 30 . . . Adhesive layer, 31 . . . Second diffusion layer, 40 . . . Backlight unit, 42 . . . Light guiding panel, 51 . . . Second barrier film, 52 . . . Second diffusion film, 53 . . . Second adhesive layer, 60 . . . Third barrier film, 61 . . . Second polyester film, 62 . . . Second adhesion layer, 63 . . . Third silica deposition layer, 64 . . . Third composite coating layer, 65 . . . Fourth silica deposition layer, 66 . . . Fourth composite coating layer, L1 . . . LED light, L2 . . . White light.

The invention claimed is:

1. A quantum dot film comprising:
a quantum dot layer containing a quantum dot compound as a fluorescent substance; and
a quantum dot protective film including:
a diffusion layer, and
a barrier film including a silica deposition layer, wherein
the barrier film has a structure in which an adhesion layer, the silica deposition layer, and a composite coating layer are laminated in this sequence on at least one surface of a polyester film,
the polyester film has a center line surface roughness (Ra) of 30 nm or less,
a ratio of oxygen to silicon, an O/Si ratio, contained in the silica deposition layer is 1.8 or more and less than 2.0 on an atomic ratio basis,
a refractive index of the silica deposition layer is 1.5 or more and 1.7 or less,
a reflectance of the quantum dot protective film is 10% or more and 20% or less at each of wavelengths of 450 nm, 540 nm and 620 nm,
a transmittance of the quantum dot protective film is 80% or more and 87% or less at each of the wavelengths of 450 nm, 540 nm, and 620 nm,
the composite coating layer is a layer containing at least one selected from a water soluble polymer, a metal alkoxide, a hydrolyzate of a metal alkoxide, and a silane coupling agent, and
the composite coating layer includes hydroxyl group-containing polymer compounds.

2. The quantum dot film according to claim 1, wherein the polyester film is a polyethylene terephthalate film formed of polyethylene terephthalate having a weight average molecular weight of 60000 or more.

3. The quantum dot film according to claim 1, wherein
the barrier film comprises two or more instances of the silica deposition layer and two or more instances of the composite coating layer, and
the two or more instances of the silica deposition layer are alternately laminated with the two or more instances of the composite coating layer.

4. The quantum dot film according to claim 1, wherein the diffusion layer, the barrier film, and quantum dot layer, the barrier film, and the diffusion layer are laminated in this sequence.

5. A backlight unit comprising an LED light source, a light guiding panel, and the quantum dot film according to claim 1 disposed on the light guiding panel.

* * * * *